US008692538B2

(12) United States Patent  
Phillips (10) Patent No.: US 8,692,538 B2  
(45) Date of Patent: Apr. 8, 2014

(54) TEST EQUIPMENT CALIBRATION (75) Inventor: Bradley A Phillips, Westlake Village, CA (US)

(73) Assignee: Teradyne, Inc., North Reading, MA (US)

(*) Notice: Subject to any disclaimer, the term of this patent is extended or adjusted under 35 U.S.C. 154(b) by 362 days.

(21) Appl. No.: 13/156,651

(22) Filed: Jun. 9, 2011

(65) Prior Publication Data

US 2012/0313618 A1 Dec. 13, 2012

(51) Int. Cl.
G01R 11/32 (2006.01)

(52) U.S. Cl.
USPC .......................................................... 324/74

(58) Field of Classification Search
USPC ........ 324/74, 76.11, 423, 532, 535, 617, 677, 324/711, 601–612; 375/224–226; 714/700, 714/741
See application file for complete search history.

(56) References Cited

U.S. PATENT DOCUMENTS

| 4,497,056 | A | 1/1985 | Sugamori |
| 5,058,087 | A | 10/1991 | Welzhofer et al. |
| 5,526,291 | A | 6/1996 | Lennen |
| 5,757,677 | A | 5/1998 | Lennen |
| 6,275,544 | B1 | 8/2001 | Aiello et al. |
| 6,492,797 | B1 | 12/2002 | Maassen et al. |
| 6,566,890 | B2 | 5/2003 | Hauptman |
| 7,120,840 | B1 | 10/2006 | Shimanouchi |
| 7,121,132 | B2 | 10/2006 | Ibane |
| 7,756,030 | B2 * | 7/2010 | Clave et al. ................. 370/230.1 |
| 7,957,461 | B2 * | 6/2011 | Huang et al. ................. 375/226 |
| 2002/0121904 | A1 | 9/2002 | Hauptman |
| 2003/0030453 | A1 | 2/2003 | Mayder et al. |
| 2003/0234645 | A1 | 12/2003 | Iorga |
| 2010/0017662 | A1 | 1/2010 | Miller |

FOREIGN PATENT DOCUMENTS

KR 10-2003-0022886 3/2003  
WO WO2006/107467 10/2006

OTHER PUBLICATIONS

Authorized officer Keun Yong Park, International Search Report and Written Opinion mailed Dec. 17, 2012 in international application No. PCT/US2012/040900, 10 pgs.

International Preliminary Report on Patentability mailed Dec. 27, 2013 PCT/US2012/040900in international application No. PCT/US2012/040900, 6 pgs.

Thaler et al., "A Suite of Novel Digital ATE Timing Calibration Methods", Proc. of the IEEE Int'l Test Conference on Discover the New World of Test and Design (Sep. 20-24, 1992). IEEE Computer Society, Washington, DC, pp. 520-529.

* cited by examiner

Primary Examiner — Melissa Koval  
Assistant Examiner — Trung Nguyen  
(74) Attorney, Agent, or Firm — Fish & Richardson P.C.

(57) ABSTRACT

Calibrating test equipment may include: aligning timing of a first group of channels in the test equipment; aligning timing of a second group of channels in the test equipment, with the second group of channels being different from the first group of channels; determining a misalignment in timing between a first channel and a second channel, with the first channel being from the first group of channels, and the second channel being from the second group of channels; and compensating, for the misalignment, channels in at least one of the first group or the second group.

22 Claims, 7 Drawing Sheets

TEST EQUIPMENT CALIBRATION

TECHNICAL FIELD

This patent application relates generally to a calibration system.

BACKGROUND

Digital automatic test equipment (ATE) faces a variety of conflicting goals, including tight timing accuracy, low cost, and high channel density. Calibration can affect the performance of such ATE, including timing accuracy.

In ATE, timing accuracy refers to applying signals to a device under test (DUT) that meet predefined timing constraints. For example, the rising edge of a signal may need to reach the DUT within a specified time-frame in order to test the DUT accurately. As the operational speeds of DUTs increase, timing accuracy becomes more critical, since there is typically less tolerance for signal time variations during testing.

The timing accuracy of ATE is dictated by its hardware and by techniques used to calibrate the ATE. For particular ATE, different calibration methods can yield different timing accuracies. Therefore, proper calibration is one way to improve timing accuracy without the often substantial cost of upgrading the ATE's hardware.

Figure 1:
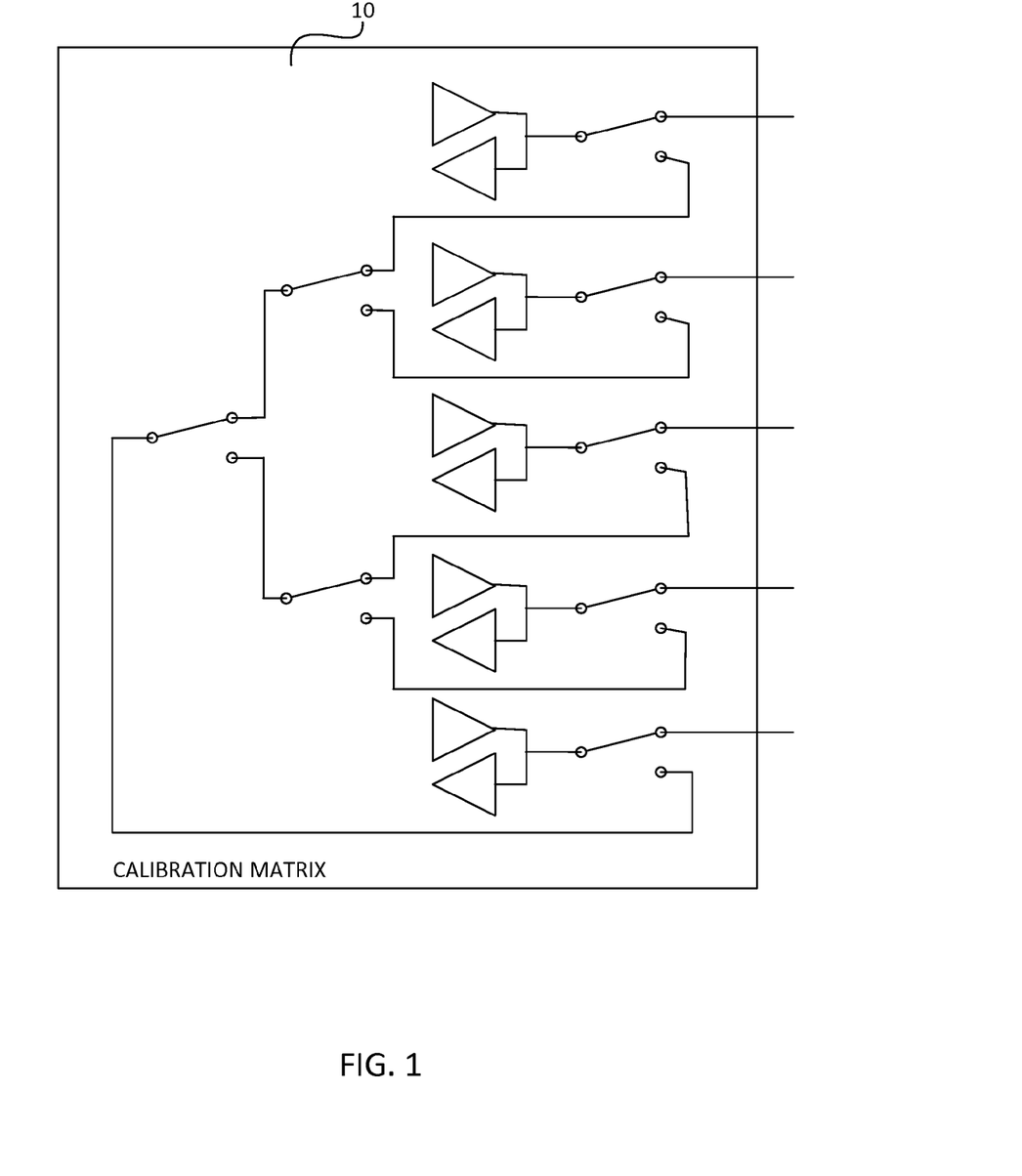
FIG. 1 is a block diagram of a prior art system that performs calibration using a calibration matrix.
Figure 2:
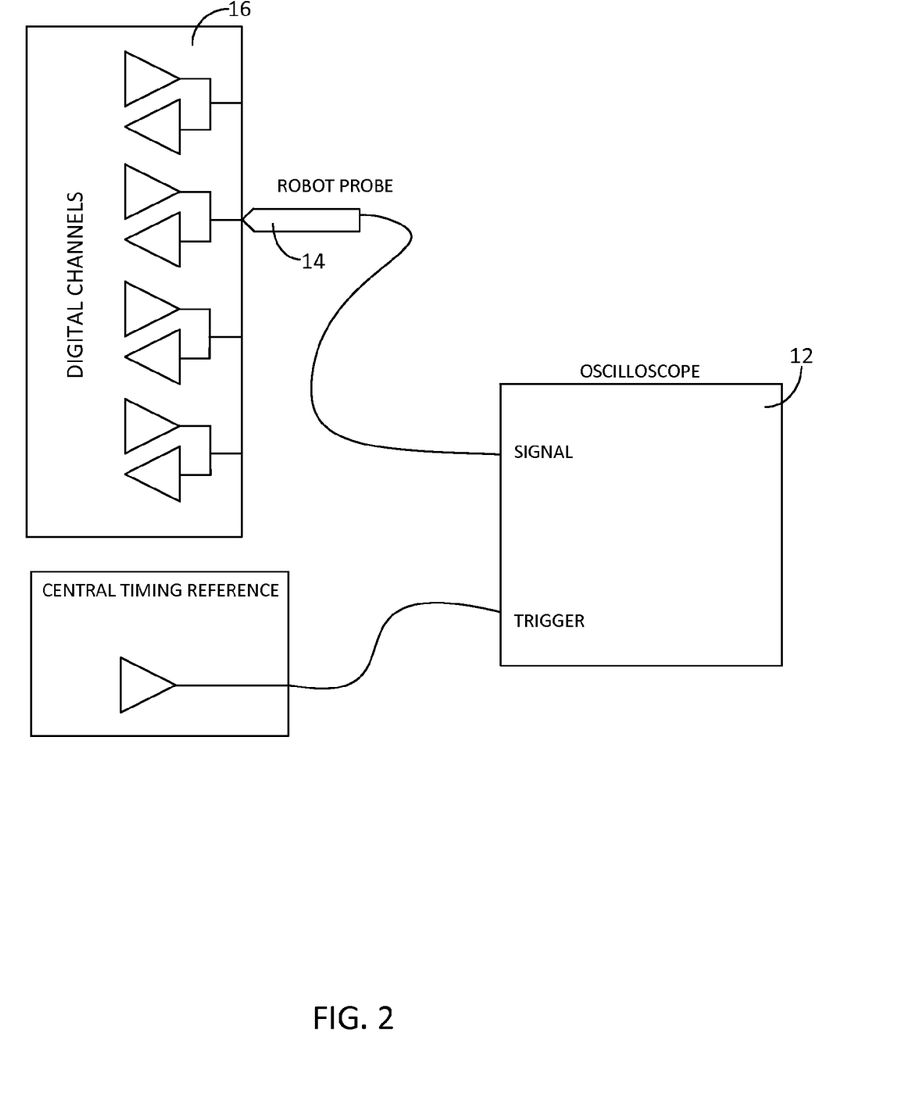
FIG. 2 is a block diagram of a prior art calibration system that performs calibration using a robotic probe and a scope.

Some ATE use an on-board calibration matrix to perform channel-to-channel timing alignment. An example of such a calibration matrix 10 is shown in FIG. 1. Here, measurements made through calibration matrix 10 provide channel-to-channel timing offset information, which can be used to calibrate individual ATE channels. An alternate approach to calibration, which uses external equipment, is shown in FIG. 2. Here, an external oscilloscope 12, together with a probing robot 14, directly measure the timing offset of each ATE channel 16. This information can be used to calibrate individual ATE channels.

The approaches shown in FIGS. 1 and 2 have advantages and disadvantages.

SUMMARY

This patent application describes methods and apparatus for calibrating test equipment.

In an example, a method of calibrating test equipment comprises: aligning timing of a first group of channels in the test equipment; aligning timing of a second group of channels in the test equipment, with the second group of channels being different from the first group of channels; determining a misalignment in timing between a first channel and a second channel, with the first channel being from the first group of channels, and with the second channel being from the second group of channels; and compensating, for the misalignment, channels in at least one of the first group or the second group. This example may include one or more of the following features, either alone or in combination.

Each channel may comprise a driver to output a signal to a device connected to the test equipment, and a comparator to receive a signal from the device connected to the test equipment. Aligning timing of a group of channels may comprise: determining first delays associated with drivers of the channels; determining second delays associated with comparators of the channels; and compensating for the first delays and the second delays; where the group of channels is the first group or the second group.

Determining the first delays and determining the second delays may comprise executing instructions to solve a set of linear equations that relate the first delays, the second delays, and measured comparator timings of the channels. Determining the first delays and determining the second delays may comprise enabling a number of channels in the group while disabling remaining channels in the group, with the set of linear equations relating the first delays, second delays of disabled channels, and measured comparator timings of enabled channels. The number of channels may be selected so as to cycle through channels in the group to generate a sufficient number of equations. As part of calibration, channels in the group of channels may be electrically connected.

Compensating for the first delays and the second delays may comprise programming delays into the channels that compensate for the first and second delays. Determining misalignment in timing between the first channel and the second channel may be performed automatically using a robotic calibration device. Determining misalignment in timing between the first channel and the second channel may be performed using a device interface board (DIB), with the DIB shorting the first channel and the second channel. The misalignment may be determined by solving a set of linear equations that are determined using relationships between the first channel and the second channel.

In another example, a system for calibrating channels comprises: a device interface board (DIB) comprising (i) interfaces to corresponding channels of a test instrument, and (ii) circuit paths that run between the interfaces and shorting points, where the circuit paths are to electrically connect a first group of channels to a first shorting point and to electrically connect a second group of channels to a second shorting point, with the second group of channels being different from the first group of channels. The system also may comprise an apparatus for use in determining a misalignment in timing between a first channel and a second channel, with the first channel being from the first group of channels, and with the second channel being from the second group of channels; and a computing device programmed to (i) align timing of the first group of channels in the test equipment, (ii) align timing the second group of channels in the test equipment, and (iii) compensate, for the misalignment, channels in at least one of the first group or the second group. This example may include one or more of the following features, either alone or in combination.

Each channel may comprise a driver to output a signal to a device connected to the test equipment, and a comparator to receive a signal from the device connected to the test equipment. Aligning a group of channels may comprise: determining first delays associated with drivers of the channels; determining second delays associated with comparators of the channels; and compensating for the first delays and the second delays; where the group of channels is the first group or the second group.

Determining the first delays and determining the second delays may comprise solving a set of linear equations that relate the first delays, the second delays, and measured comparator timings of the channels. Compensating for the first delays and the second delays may comprise programming delays into the channels that compensate for the first and second delays. The apparatus may comprise a robotic calibration device. The apparatus may comprise a second DIB, where the second DIB is for electrically connecting the first channel and the second channel and the computing device is programmed to determine the misalignment by solving a set of linear equations that are determined using relationships between the first channel and the second channel.

In another example, a method is described for calibrating channels, where each of the channels has a driver delay and a comparator delay. The method comprises: (i) organizing the channels into groups of channels, where each group is electrically connected to a shorting point; and (ii) for each group of channels: enabling a number of channels while disabling a remainder of the channels; measuring, at the disabled channels, timing of a composite signal composed of the enabled channels; generating a system of equations in which, for each disabled channel, a comparator time is equated to an average of a driver time for all enabled channels; solving the system of equations to obtain, for each channel, the driver delay and the comparator delay; and calibrating the channels in each group using the driver delay and the comparator delay. The method may further comprise: selecting a channel from each group; aligning the selected channels; and aligning all channels in a group based on alignment of the selected channels. This example may include one or more of the following features, either alone or in combination.

The groups may be connected to a shorting point on a device interface board (DIB) that is connected to an instrument containing the channels. Aligning the selected channels may comprise measuring misalignment of the selected channels using a robotic calibration device and an oscilloscope. The selected channels may be electrically connected on a device interface board (DIB).

In an example, an apparatus for calibrating test equipment comprises: first means for (i) aligning timing of a first group of channels in the test equipment, and (ii) aligning timing of a second group of channels in the test equipment, with the second group of channels being different from the first group of channels; and second means for determining a misalignment in timing between a first channel and a second channel, with the first channel being from the first group of channels, and with the second channel being from the second group of channels. The first means may also be for compensating, for the misalignment, channels in at least one of the first group or the second group.

Any two or more of the features described in this patent application, including this summary section, may be combined to form embodiments not specifically described in this patent application.

Parts of the foregoing may be implemented as a computer program product comprised of instructions that are stored on one or more non-transitory machine-readable storage media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Semiconductor manufacturers generally test semiconductor devices at various stages of production. During manufacturing, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many semiconductor manufacturers test integrated circuits at the wafer level, before a wafer is cut into dice. Defective circuits are marked and generally discarded prior to packaging, thus saving the cost of packaging defective dies. As a final check, many manufacturers test each finished product before it is shipped.

To test quantities of semiconductor components, manufacturers commonly use automatic test equipment ("ATE" or "testers"). In response to instructions in a test program, a tester automatically generates input signals to be applied to an integrated circuit, and monitors output signals. The tester compares the output signals with expected responses to determine whether the device under test (DUT) is defective.

Customarily, component testers are designed in two different portions. A first portion, called a "test head" includes circuitry that may be located close to the DUT, for example, driving circuitry, receiving circuitry, and other circuitry for which short electrical paths are beneficial. A second portion, called a "tester body," is connected to the test head via cables, and contains electronics that may not be close to the DUT.

Special machines move and electrically connect devices to a tester in succession. A "prober" is used to move devices at the semiconductor wafer level. A "handler" is used to move devices at the packaged device level. Probers, handlers, and other devices for positioning a DUT relative to a tester are generically known as "peripherals." Peripherals generally include a site where DUTs are positioned for testing. The peripheral feeds a DUT to the test site, the tester tests the DUT, and the peripheral moves the DUT away from the test site, so that another DUT can be tested.

Figure 3:
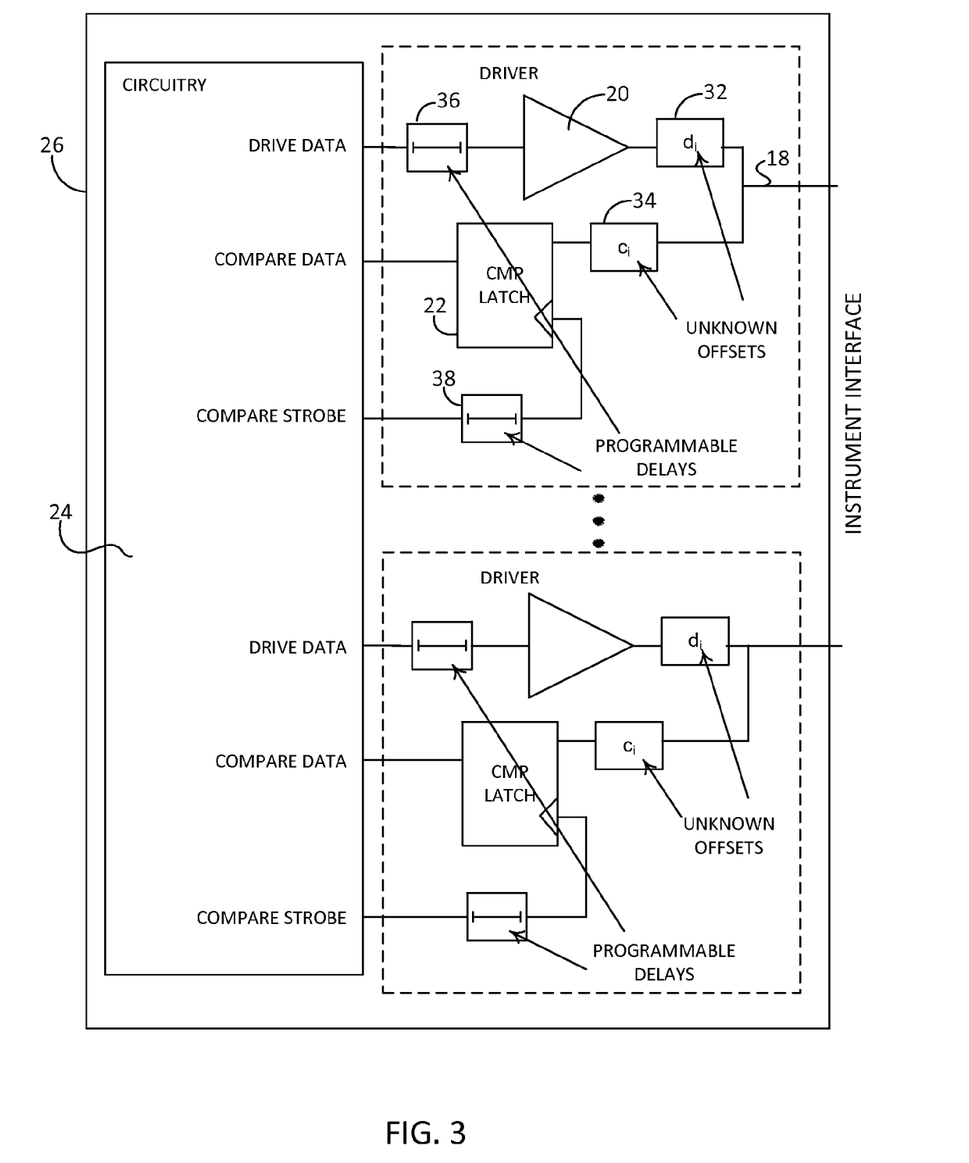
FIG. 3 is a block diagram of automatic test equipment (ATE) containing multiple channels for testing devices.

ATEs include multiple channels, over which signals are sent between the ATE and a DUT. Referring to FIG. 3, each such channel 18 includes a driver 20 and a comparator 22. The driver sends signals from ATE 26 to the DUT (not shown). The comparator receives signals from the DUT, compares the received signals to known (strobe) values, and sends results of such comparisons to circuitry 24 included in the ATE. Timing delays between channels can affect the accuracy of measurements made by the ATE. The channels may be calibrated to reduce such timing delays. Calibration may include, e.g., determining timing differences between two or more channels, and programming delays into channels that are deemed "faster" in order to substantially equalize the channels' transmission timings.

The calibration process described herein may include calibrating individual groups of channels, selecting a channel from each group, calibrating those selected channels, and calibrating channels in the individual groups to match the calibration of the selected channels. The channels within the groups may be calibrated automatically using a computer and/or other electronics, and the selected channels from the groups may be calibrated, at least in part, using e.g., a probe and an oscilloscope ("scope").

Figure 4:
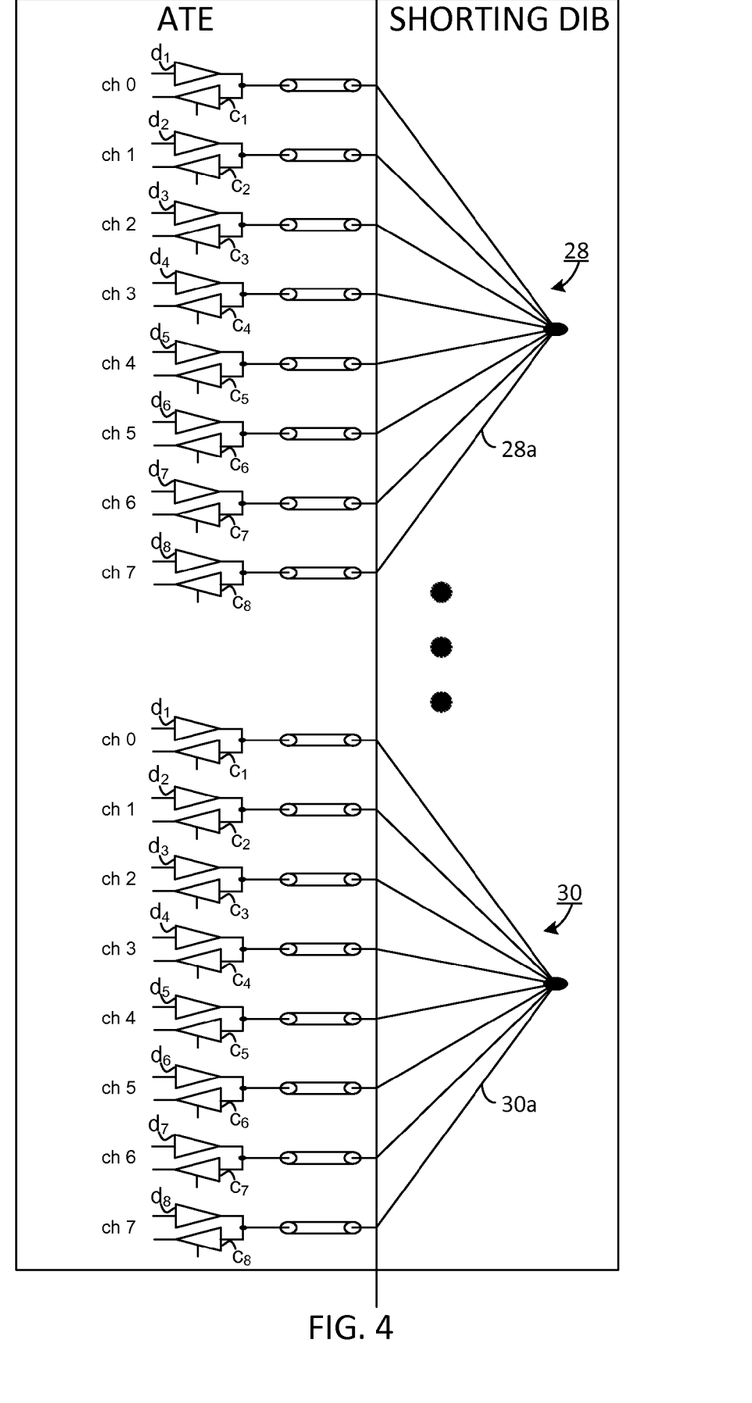
FIG. 4 is a block diagram of a device interface board (DIB) containing eight-channel shorted groups.

Referring to FIG. 4, in an example, such a process for calibrating test equipment (e.g., ATE) may include the following: aligning timing of channels in a first group 28 of channels in the test equipment; aligning timing of channels in subsequent groups of channels in the test equipment, including channels in a second group 30, where the second group of channels is different from the first group of channels; determining a misalignment in timing between a first channel 28a and subsequent channels including a second channel 30a, where the first channel is from the first group of channels, and the second channel is from the second group of channels; and compensating, for the misalignment, channels in at least one of the first group or the second group. As indicated above, the compensation may include, e.g., programming delays into one or more of the compensated channels.

In an example implementation, the calibration process described herein may include mounting a special calibration device interface board (DIB) to the ATE. In general, a DIB is a custom circuit board that interfaces tester channels to a specific end-customer device. Special calibration DIBs are commonly designed that do not connect to a DUT, but rather provide connections for calibration (e.g., loopback connections between channels, straight through to a pad that can be probed, etc.). In this example, the DIB shorts together groups of channels, and performs a series of measurements for use in aligning the channels within each group to one another. This process is referred to herein as "shorted calibration".

A probing robot and an oscilloscope are used to determine timing offsets of one out of every N (N≥1) (e.g., eight) channels on the ATE (e.g., channels 28a, 30a, etc.). For example, the probing robot and oscilloscope may be used to determine timing offsets of one channel out of each shorted group of channels by comparing signal transmission times. The differences in signal transmission times are used to obtain timing corrections for channels on the ATE. These timing corrections can be introduced into various channels to provide better channel timing alignment. For example, timing delays may be programmed into registers in "faster" channels. This type of "hybrid" calibration, which includes both a shorted calibration component and a robotic calibration component, can result in a time savings relative a full robot calibration, since only 1/N (e.g., ⅛) as many channels are probed with the robot.

In the example provided here, the calibration process is presented in terms of a simple model of a digital tester channel, shown in FIG. 3, which is assumed to have zero delay. The driver also supplies a 50 ohm termination while the comparator is being used.

Figure 5:
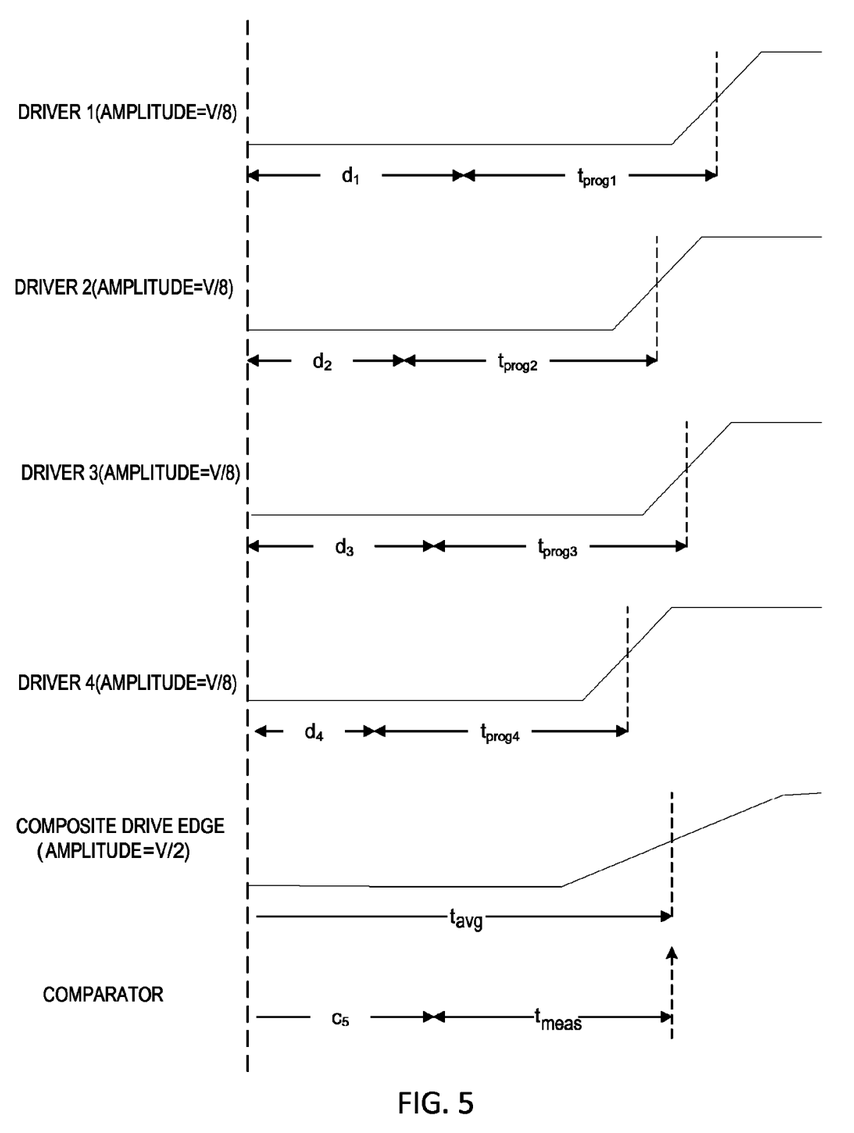
FIG. 5 contains graphs showing timing diagrams of driver amplitude versus delay time, both inherent and programmed.

To calibrate the ATE, values for the driver delay ($d_i$) 32 and comparator delay ($c_i$) 34 for all channels are determined, so that they may be corrected using programmable delays 36, 38. These values may be determined using shorted calibration, as described below. It is noted that the propagation delays are affected by the programmed voltage levels of the driver, and the input swing to the comparator. To calibrate groups of channels, a shorting DIB electrically interconnects channels to produce groups of channels that are shorted to each other. An example of such a DIB is shown in FIG. 4. In the example of FIG. 4, there are eight channels per group; however, any appropriate number of channels may be included in a group. As shown in FIG. 4, in an example, channels 28 are shorted to one another, not to ground. When one of the eight channels drives a signal of (open-circuit) amplitude V into the group 28 of channels, that signal is divided at the shorting node, resulting in a signal of amplitude V/8 reaching each of the remaining seven comparators. However, in this example, to properly calibrate a comparator (e.g., $c_5$), it may be preferable for the received signal to have an amplitude V/2, as if the comparator were being driven by a 50Ω source. To achieve this, drivers from four of the channels are turned-on at the same time (e.g., drivers $d_1$ to $d_4$ of channels 28) and the remaining drivers are turned off (e.g., drivers $d_5$ to $d_8$ of channels 28). What occurs in this case is shown in FIG. 5, which depicts graphs showing diagrams of driver amplitude versus delay time, both inherent ($d_n$) and programmed ($t_{progn}$), and a composite signal (e.g., the sum of the reflected drive signals) received at a comparator (e.g., $c_5$).

The composite signal arriving at comparator $c_5$ has an amplitude V/2, in this example. Furthermore, the timing of this composite drive edge is approximately equal to the average of the timing of the four contributing drivers, as expressed below $$t_{avg} = \frac{1}{4}(t_{d1} + t_{d2} + t_{d3} + t_{d4}), \tag{1}$$

where $t_{di} = d_i + t_{progi}$, and $t_{progi}$ is the programmed delay of the $i^{th}$ driver. It is possible to search for this edge using the comparator timing. More specifically, since the comparator also has an unknown timing offset, it is possible to construct the following equation relating the measured comparator timing, $t_{meas}$, to the offsets:

$$t_{meas} = -c_i + 0.25 t_{d1} + 0.25 t_{d2} + 0.25 t_{d3} + 0.25 t_{d4} \tag{2}$$

Equation (2) is a linear equation expressing the relationship between the drive and compare timing offsets. An equation like equation (2) can be generated for any given choice of four drive channels. That is, there are four measurements (corresponding to the comparators on the four non-driving channels), and the same sequence may be repeated for many other combinations of drivers (there are 70 ways to select four drivers out of a set of eight). By repeating this measurement sequence for many driver permutations, and constructing four linear equations each time, it is possible to accumulate enough equations to solve for the drive and compare offsets, and use this information calibrate the channels. The following provides an example of generating such a system of solvable linear equations.

Figure 6:
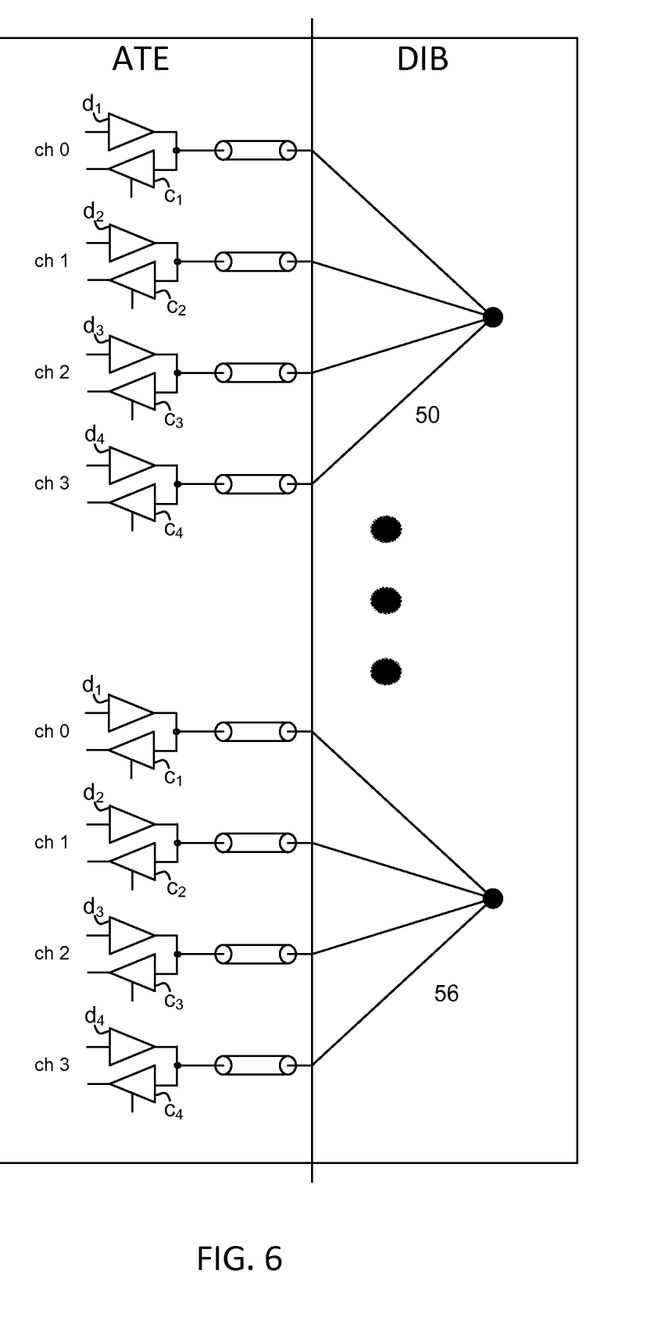
FIG. 6 is a block diagram of a DIB containing four-channel shorted groups.

The linear system for an eight-way short is quite large (16 equations in 16 unknowns, minimum, resulting in up to 280 equations if all possible measurements are used). For simplicity, the following example shows the math for a four-way short, which is depicted in FIG. 6. The above technique works for a four-way short just as well as an eight-way short, except with two drivers active at a time instead of four (as is the case in an eight-way short). In the example of FIG. 6, in a single shorted group, there are six possible pairs of drive/compare configurations:

0 and 1 driving, 2 and 3 comparing
0 and 2 driving, 1 and 3 comparing
0 and 3 driving, 1 and 2 comparing
1 and 2 driving, 0 and 3 comparing
1 and 3 driving, 0 and 2 comparing
2 and 3 driving, 0 and 1 comparing Each configuration produces two measurements, and thus two equations, as follows:

$$t_1 = -c_2 + 0.5t_{d0} + 0.5t_{d1}$$
$$t_2 = -c_3 + 0.5t_{d0} + 0.5t_{d1}$$
$$t_3 = -c_1 + 0.5t_{d0} + 0.5t_{d2}$$
$$\vdots$$
$$t_{12} = -c_1 + 0.5t_{d2} + 0.5t_{d3}$$

(3)

The resulting linear system of equations (3) is underdetermined by one degree. To make the system solvable, the following additional constraint is added:

$$t_{d0} = 0 \qquad (4)$$

The free degree corresponds to a constant offset in the drive and compare offset of all the channels in the group. This is another way of saying that channel groups cannot be aligned to one another without some measurement against a common reference. This common reference may be obtained by measuring one driver from each channel group with an external oscilloscope.

From equations (3) and (4), a full linear system can be built. In matrix form, this linear system is represented as follows:

$$\begin{bmatrix} 0 & 0 & -1 & 0 & 0.5 & .05 & 0 & 0 \\ 0 & 0 & 0 & -1 & 0.5 & 0.5 & 0 & 0 \\ 0 & -1 & 0 & 0 & 0.5 & 0 & 0.5 & 0 \\ 0 & 0 & 0 & -1 & 0.5 & 0 & 0.5 & 0 \\ 0 & -1 & 0 & 0 & 0.5 & 0 & 0 & 0.5 \\ 0 & 0 & -1 & 0 & 0.5 & 0 & 0 & 0.5 \\ -1 & 0 & 0 & 0 & 0 & 0.5 & 0.5 & 0 \\ 0 & 0 & 0 & -1 & 0 & 0.5 & 0.5 & 0 \\ -1 & 0 & 0 & 0 & 0 & 0.5 & 0 & 0.5 \\ 0 & 0 & -1 & 0 & 0 & 0.5 & 0 & 0.5 \\ -1 & 0 & 0 & 0 & 0 & 0 & 0.5 & 0.5 \\ 0 & -1 & 0 & 0 & 0 & 0 & 0.5 & 0.5 \\ 0 & 0 & 0 & 0 & 1 & 0 & 0 & 0 \end{bmatrix} \cdot \begin{bmatrix} c_0 \\ c_1 \\ c_2 \\ c_3 \\ t_{d0} \\ t_{d1} \\ t_{d2} \\ t_{d3} \end{bmatrix} = \begin{bmatrix} t_1 \\ t_2 \\ t_3 \\ t_4 \\ t_5 \\ t_6 \\ t_7 \\ t_8 \\ t_9 \\ t_{10} \\ t_{11} \\ t_{12} \\ 0 \end{bmatrix} \qquad (5)$$

The system of equations (5) may be solved using standard singular-value techniques to obtain values for the drive timing offsets ($t_{dn}$) and compare timing offsets ($c_n$). For example, the equations may be solved using a computer or other programmable processing device or circuitry that may be part of, or in communication with, the ATE.

The above system is over-determined (thirteen equations in eight unknowns). The singular value technique will effectively perform a multidimensional least-squares fit to find a reduced-error (e.g., minimum error) solution. The resulting drive timing offsets and compare timing offsets may be used to determine programmable delays (e.g., $d_n$ and $c_n$ values of FIG. 3) to program into appropriate registers in the drive and compare portions of the channels to provide the appropriate intra-group channel calibration.

A single channel, such as channels 50 . . . 56, from each group of channels may then be selected. A probing robot and an oscilloscope (or other such measurement devices) are used to determine timing offsets for each of these selected channels. The resulting additional timing offsets, which are determined using these techniques, may be programmed into appropriate registers in the drive and compare portions of each channel to provide the appropriate inter-group channel calibration. That is, because all channels in a group are aligned, the same timing offset is programmed into each channel in that group in order to align the channels of one group to channels of another group. In this manner, groups of channels are aligned, without requiring measurement of all channels.

The process described above may not take into account the lengths of the signal paths on the shorting DIB. To compensate for these lengths, the trace length on the DIB may be subtracted from all of the timing corrections. This length typically can be characterized on the bench for later use, or can be measured at calibration time using TDR (Time Domain Reflectometry), although TDR may be complicated by the odd reflection that comes back from the eight-way short. Generally, TDR is a process of sending an electrical pulse down a signal path, and 'listening' for the echo off the end of the line. The timing of the echo can be used to determine the electrical length of the signal path.

As noted above, the process described herein is predicated on the assumption that the timing of the composite of four drive edges will be the average of the individual contributors. This is true if (i) all four of the contributing edges have identical slew rates, and (ii) the drivers are already aligned closely enough that their transitions overlap. The first assumption can be addressed by iterating (i.e., repeating) the process. The error term due to differing slew rates converges to zero as the contributing edges are more closely aligned. Therefore, if each iteration uses the results of the previous iteration to set the drive edge timing, the slew rate error can be substantially eliminated. Results show that three iterations are more than enough for the process to fully converge, with two iterations likely to be adequate. The second assumption can be addressed with a simple pre-calibration to coarsely align the drivers. For most cases, the drivers may be aligned sufficiently.

The following table compares the quality of the hybrid calibration process described herein to that of a single-step process, such as oscilloscope-only calibration. In particular, comparison is made between using hybrid calibration to calibrate eight-channel groups and calibrating those same eight channel groups using a robotic probe and an oscilloscope. The table below summarizes this comparison.

|  | Drive EPA % Difference, all channels, hybrid calibration relative to scope calibration |
| --- | --- |
| Spread | +20% |
| Standard Deviation | +16% |

In this regard, EPA (Edge Placement Accuracy) is a standard measure of a digital instrument's timing performance. To measure EPA, the timing of the drive edge or compare strobe is measured relative to a fixed reference. The delta from the programmed position is recorded. The EPA is the spread of these deltas across all channels, for a variety of conditions (waveform patterns, periods, voltage levels, etc.). Typically, EPA is specified as a +/−number—for example, on an instrument that guarantees this spread to be less than 300 ps, the specification for EPA would be listed as +/−150 ps.

One of the benefits of using the hybrid calibration described herein may be improved execution time, and thus reduced calibration time. The table below shows comparisons, for one and two board systems, of percentage differences between execution times for an oscilloscope calibration ("full scope cal") versus the hybrid calibration process described herein ("scope+shorted cal").

| Scope + shorted cal, 1 board: % difference relative to full scope cal., 1 board | Scope + shorted cal, 2 boards: % difference relative to full scope cal., 2 boards |
| --- | --- |
| 74% | 79% |

The total time for hybrid calibration on every eighth channel is about 75% of the time for a full oscilloscope calibration on one board, with the advantage increasing as more channels are calibrated. This is because the shorted calibration component of the hybrid calibration system can process designated groups of channels in parallel. As a result, its runtime will not typically increase considerably with increased channel count. It is also worth noting that the pure oscilloscope calibration measures the drivers only. The comparators are measured in a separate step (likely requiring about 1-2 minutes additional time). Shorted calibration already includes calibration of both drive and compare timing.

The shorted calibration process can be extended to shorting groups of any even size greater than two. However, physical considerations may limit the group size that can be calibrated. In some cases, using current technology, the size of the drive signal contributed by each channel may become very small, making noise a concern. In other cases, using current technology, it may become difficult to lay-out an acceptable shorting node on a DIB for more than about eight channels, since this may require too many traces to converge in too small of an area on the DIB. These issues can be addressed using higher cost solutions.

As noted herein, up to 280 different measurements are possible with an eight-way short, when (theoretically) only 16 appropriately chosen measurements are needed. This number goes up super-exponentially with increasing group size. An implementation may use all 280 measurements in its computation. Picking an appropriate subset could improve runtime and may be advantages for larger groups, such as a 16-way channel group short, which has over 100,000 possible drive/compare measurements.

The choice of enabling half of the drivers in the shorted group is based on the desire to have the compare voltage swing equal to half the drive swing (just as if the comparator was operating in a 50Ω environment). However, by enabling different numbers of driver, different swings will arrive at the comparator, allowing for the possibility of calibration for the effect of voltage levels on timing.

Figure 7:
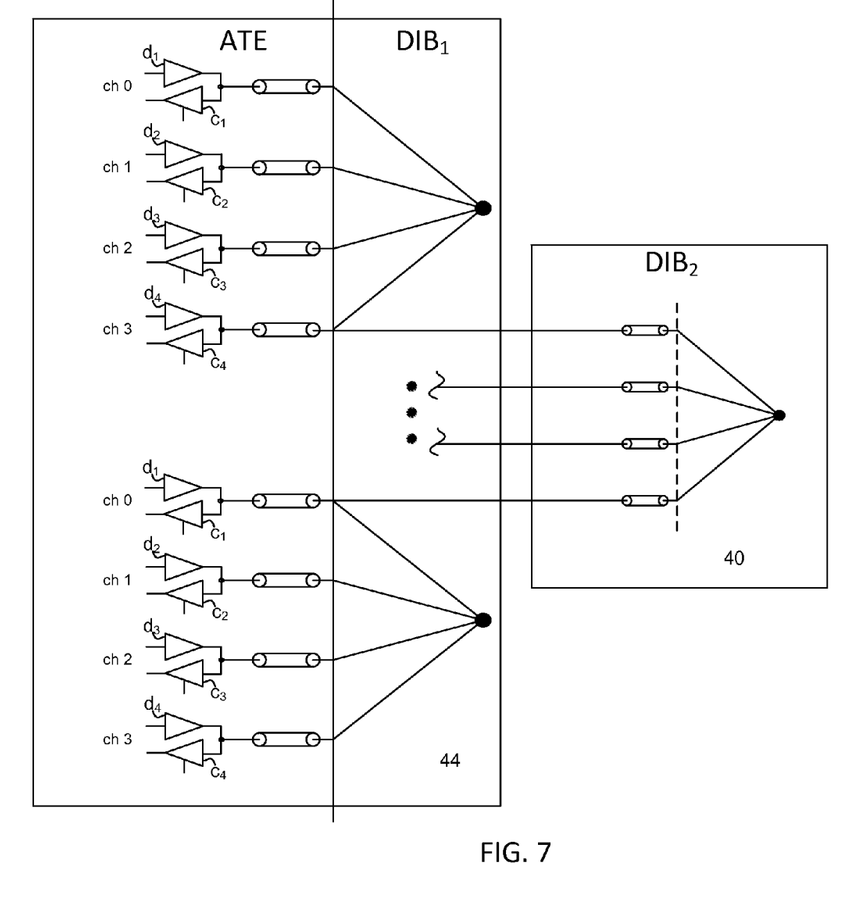
FIG. 7 is block diagram showing multiple DIBs used to calibrate test channels of ATE without the aid of a robotic probe and scope.

In some implementations, the oscilloscope can be eliminated. By using a second shorting DIB with chosen channel interconnections, an arbitrarily large number of channels can be aligned to one another. In other words, it is possible to use a second DIB, in place of the robotic probe and oscilloscope described above, to determine calibration values for selected channels among groups of channels calibrated using a first DIB. For example, as shown in FIG. 7, this second shorting DIB 40 may short one channel from each of eight shorting groups 42 on a first DIB 44. A system of equations, such equations (5) can be determined for these selected channels of DIB 40 in the manner described above, and the inter-channel timing offsets can be determined by solving the system of equations. Using multiple measurement layers in this way could eliminate the need for an oscilloscope. This process can be extended to N (N≥2) DIBs used in this manner to obtain drive/compare offsets for various channels.

Features described herein, such as solving equations (5), can be implemented, at least in part, via a computer program product, i.e., a computer program tangibly embodied in one or more non-transitory information carriers, e.g., in one or more tangible, non-transitory machine-readable storage media, for execution by, or to control the operation of, data processing apparatus, e.g., a programmable processor, a computer, or multiple computers A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the control features can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different embodiments described herein may be combined to form other embodiments not specifically set forth above. Elements may be left out of the structures described herein without adversely affecting their operation. Furthermore, various separate elements may be combined into one or more individual elements to perform the functions described herein.

Elements of different implementations described herein may be combined to form other implementations not specifically set forth above. Other implementations not specifically described herein are also within the scope of the following claims.

What is claimed is:
1. A method of calibrating test equipment, the method comprising:
  aligning timing of a first group of channels in the test equipment;
  aligning timing of a second group of channels in the test equipment, the second group of channels being different from the first group of channels;
  determining a misalignment in timing between a first channel and a second channel, the first channel being from the first group of channels, and the second channel being from the second group of channels; and
  compensating, for the misalignment, channels in at least one of the first group or the second group.

2. The method of claim 1, wherein each channel comprises a driver to output a signal to a device connected to the test equipment, and a comparator to receive a signal from the device connected to the test equipment; and
    wherein aligning timing of a group of channels comprises:
        determining first delays associated with drivers of the channels;
        determining second delays associated with comparators of the channels; and
        compensating for the first delays and the second delays;
        wherein the group of channels is the first group or the second group.

3. The method of claim 2, wherein determining the first delays and determining the second delays comprise executing instructions to solve a set of linear equations that relate the first delays, the second delays, and measured comparator timings of the channels.

4. The method claim 3, wherein determining the first delays and determining the second delays comprise enabling a number of channels in the group while disabling remaining channels in the group, the set of linear equations relating the first delays, second delays of disabled channels, and measured comparator timings of enabled channels.

5. The method claim 4, further comprising selecting the number of channels so as to cycle through channels in the group to generate a sufficient number of equations.

6. The method of claim 2, wherein, as part of calibration, channels in the group of channels are electrically connected.

7. The method of claim 3, wherein compensating for the first delays and the second delays comprises programming delays into the channels that compensate for the first and second delays.

8. The method of claim 1, wherein determining misalignment in timing between the first channel and the second channel is performed automatically using a robotic calibration device.

9. The method of claim 1, wherein determining misalignment in timing between the first channel and the second channel is performed using a device interface board (DIB), the DIB shorting the first channel and the second channel and determining the misalignment by solving a set of linear equations that are determined using relationships between the first channel and the second channel.

10. A system for calibrating channels, the system comprising:
    a device interface board (DIB) comprising (i) interfaces to corresponding channels of a test instrument, and (ii) circuit paths that run between the interfaces and shorting points, the circuit paths to electrically connect a first group of channels to a first shorting point and to electrically connect a second group of channels to a second shorting point, the second group of channels being different from the first group of channels;
    an apparatus for use in determining a misalignment in timing between a first channel and a second channel, the first channel being from the first group of channels, and the second channel being from the second group of channels; and
    a computing device programmed to (i) align timing of the first group of channels in the test equipment, (ii) align timing the second group of channels in the test equipment, and (iii) compensate, for the misalignment, channels in at least one of the first group or the second group.

11. The system of claim 10, wherein each channel comprises a driver to output a signal to a device connected to the test equipment, and a comparator to receive a signal from the device connected to the test equipment; and
    wherein aligning a group of channels comprises:
        determining first delays associated with drivers of the channels;
        determining second delays associated with comparators of the channels; and
        compensating for the first delays and the second delays;
        wherein the group of channels is the first group or the second group.

12. The system of claim 11, wherein determining the first delays and determining the second delays comprise solving a set of linear equations that relate the first delays, the second delays, and measured comparator timings of the channels.

13. The system of claim 12, wherein compensating for the first delays and the second delays comprises programming delays into the channels that compensate for the first and second delays.

14. The system of claim 10, wherein the apparatus comprises a robotic calibration device.

15. The system of claim 10, wherein the apparatus comprises a second DIB, the second DIB for electrically connecting the first channel and the second channel and the computing device being programmed to determine the misalignment by solving a set of linear equations that are determined using relationships between the first channel and the second channel.

16. A method for calibrating channels, each of the channels having a driver delay and a comparator delay, the method comprising:
    organizing the channels into groups of channels, each group being electrically connected to a shorting point;
    for each group of channels:
        enabling a number of channels while disabling a remainder of the channels;
        measuring, at the disabled channels, timing of a composite signal composed of the enabled channels;
        generating a system of equations in which, for each disabled channel, a comparator time is equated to an average of a driver time for all enabled channels;
        solving the system of equations to obtain, for each channel, the driver delay and the comparator delay; and
        calibrating the channels in each group using the driver delay and the comparator delay;
    selecting a channel from each group;
    aligning the selected channels; and
    aligning all channels in a group based on alignment of the selected channels.

17. The method of claim 16, wherein the groups are connected to a shorting point on a device interface board (DIB) that is connected to an instrument containing the channels.

18. The method of claim 16, wherein aligning the selected channels comprises measuring misalignment of the selected channels using a robotic calibration device and an oscilloscope.

19. The method of claim 18, wherein the selected channels are electrically connected on a device interface board (DIB).

20. An apparatus for calibrating test equipment, the apparatus comprising:
    first means for (i) aligning timing of a first group of channels in the test equipment, and (ii) aligning timing of a second group of channels in the test equipment, the second group of channels being different from the first group of channels; and
    second means for determining a misalignment in timing between a first channel and a second channel, the first channel being from the first group of channels, and the second channel being from the second group of channels;

wherein the first means is also for compensating, for the misalignment, channels in at least one of the first group or the second group.

21. One or more non-transitory machine-readable storage media storing instructions that are executable to calibrate channels that are organized into groups of channels, each group being electrically connected to a shorting point, the instructions being executable by one or more processing devices to perform operations comprising:

for each group of channels:
generating a system of equations in which, for each disabled channel, a comparator time is equated to an average of a driver time for all enabled channels;
solving the system of equations to obtain, for each channel, the driver delay and the comparator delay; and
calibrating the channels in each group using the driver delay and the comparator delay;
selecting a channel from each group; and
aligning all channels in a group based on an alignment of the selected channels.

22. The one or more non-transitory machine-readable storage media of claim 21, wherein the selected channels are electrically connected on a device interface board (DIB).

* * * * *